(12) United States Patent
Yazdy

(10) Patent No.: US 6,201,414 B1
(45) Date of Patent: Mar. 13, 2001

(54) PULSE WIDTH MODULATION CIRCUIT

(75) Inventor: Mostafa R. Yazdy, Los Angeles, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/428,822

(22) Filed: Oct. 28, 1999

(51) Int. Cl.$^7$ .................................................. H03K 19/00
(52) U.S. Cl. ............................ 326/93; 326/99; 327/261; 327/276
(58) Field of Search .................................. 326/29, 93, 96, 326/99; 327/141, 161, 261, 276

(56) References Cited

U.S. PATENT DOCUMENTS 5,973,525 * 10/1999 Fujii ...................................... 327/158
6,150,847 * 11/2000 Lu .......................................... 326/93

* cited by examiner

*Primary Examiner*—Michael Tokar
*Assistant Examiner*—Anh Q. Tran
(74) *Attorney, Agent, or Firm*—Fariba Rad

(57) ABSTRACT

A pulse width modulation circuit utilizes a clock divider to generate a plurality of clocks to be used by a plurality of delay blocks. Each delay block has plurality of delay elements each of which receives one the plurality of clocks. Each delay block receives a delay data, selects a number of the plurality of clocks based on the delay data and activates the respective delay elements for delaying its input signal.

12 Claims, 9 Drawing Sheets

FIG. 9
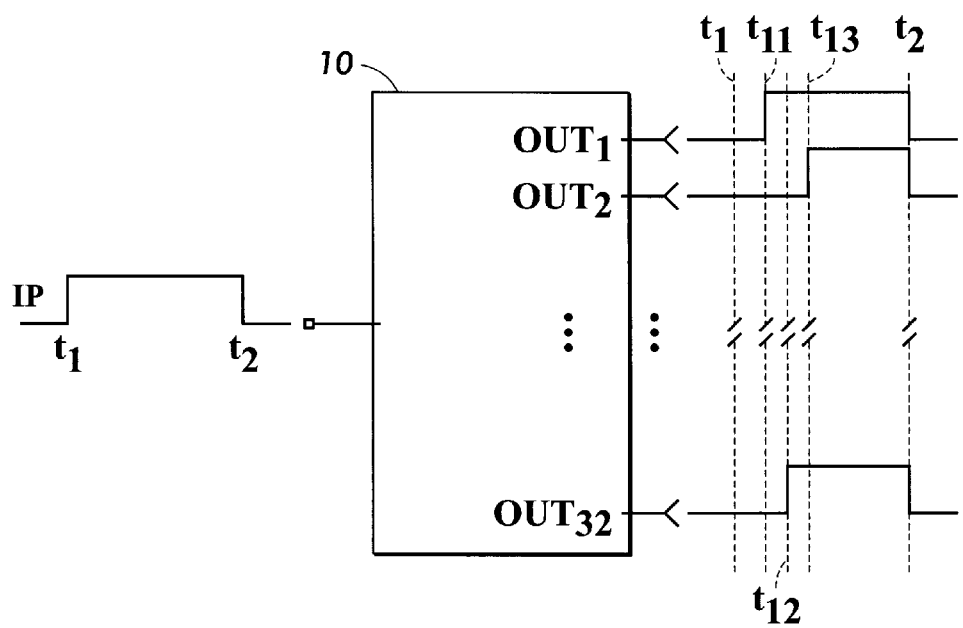
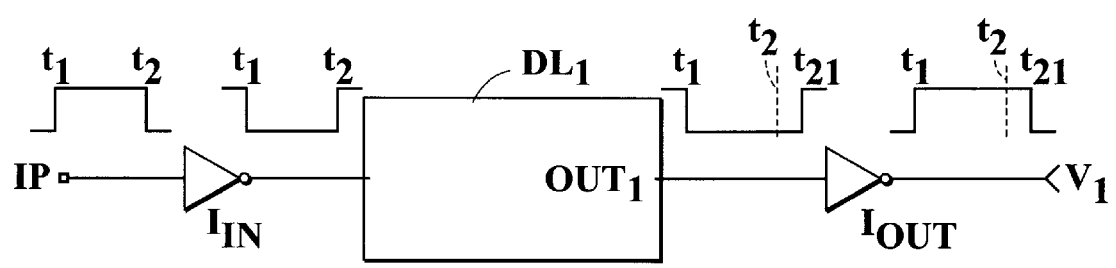
FIG. 10

US 6,201,414 B1

PULSE WIDTH MODULATION CIRCUIT

BACKGROUND OF THE INVENTION

This invention relates to pulse width modulation and more particularly to a logic design which significantly reduces the number of required logic blocks and the size of the chip containing the pulse width modulation logic.

Typically, for pulse width modulation using digit delay, a logic design with numerous logic blocks such as D flip flops are needed. Referring to FIG. 1, there is shown a prior art logic diagram which utilizes four positive edge triggered D flip flops to delay a signal for 4 mclock cycles. Referring to FIG. 2, there are shown signals of a clock C, an input signal D, and output signals $D_1$, $D_2$, $D_3$, and $D_4$. Referring to both FIGS. 1 and 2, the input signal D is applied to $DF_1$ which will be held until the rising edge $t_1$ of the clock C sends out the input D to the output $D_1$. As a result, input D is delayed by T'. $D_1$ reaches $DF_2$ slightly after the rising edge $t_1$ of clock C reaches $DF_2$. Therefore, $D_1$ will be sent to the next flip flop $DF_3$ on the rising edge $t_2$ of the clock C. As a result, the delay created by $DF_2$ is T which is equal to one cycle of clock C. In the same manner the delay created by $DF_3$ and $DF_4$ each is equal to one period T of the clock C.

The logic block diagram of FIG. 1 is a typical delay logic. Using this logic design requires a number of flip flops equal to the required number of delays. For example, if 32T delays are required, 32 flip flops will be needed. This design can become quite large if a delay of for example up to 64T is needed for 32 lines. This means that each line has to have 64 flip flops resulting in total 32×64=2068 flip flops.

It is an object of this invention to reduce the number of flip flops and the size and cost of a chip containing pulse width modulation circuit with plurality of delay requirements.

SUMMARY OF THE INVENTION

In accordance with one aspect of this invention, a pulse width modulation circuit comprises a clock dividing block for receiving a system clock and generating a plurality of clocks with different clock cycles. A delaying block receives a signal and delays the signal. The delaying block has a plurality of delaying elements. Each one of the plurality of delaying elements receives one of the plurality of clocks. The delaying block receives a delay data and responds to the delay data for selecting a number of the plurality of clocks based on the delay data and activates the respective delaying elements. The delaying block is so constructed and arranged to cause the signal to pass through the activated delaying elements and bypass the inactivated delaying elements.

In accordance with another aspect of this invention, a pulse width modulation circuit comprises a clock dividing block for receiving a system clock and generating a plurality of clocks with different clock cycles. A plurality of delaying blocks receive a signal and delay the signal according to a plurality of data. Each of the delaying block has a plurality of delaying elements. Each of the plurality of delaying elements of each delaying blocks receives one of the plurality of clocks. Each of the plurality of delaying blocks receives one of the plurality of delay data and responds to the respective delay data for selecting a number of the plurality of clocks based on the delay data and activates the respective delaying elements. Each of the delaying blocks being so constructed and arranged to cause the signal to pass through the respective activated delaying elements and bypass the respective inactivated delaying elements.

BRIEF DESCRIPTION OF THE DRAWINGS

FIG. 9 shows how the delay logic of FIG. 3 provides pulse width modulation; and

FIG. 10 shows an alternative pulse width modulation through delaying the opposite edge of the input pulse.

DESCRIPTION OF THE PREFERRED EMBODIMENT

Figure 3:
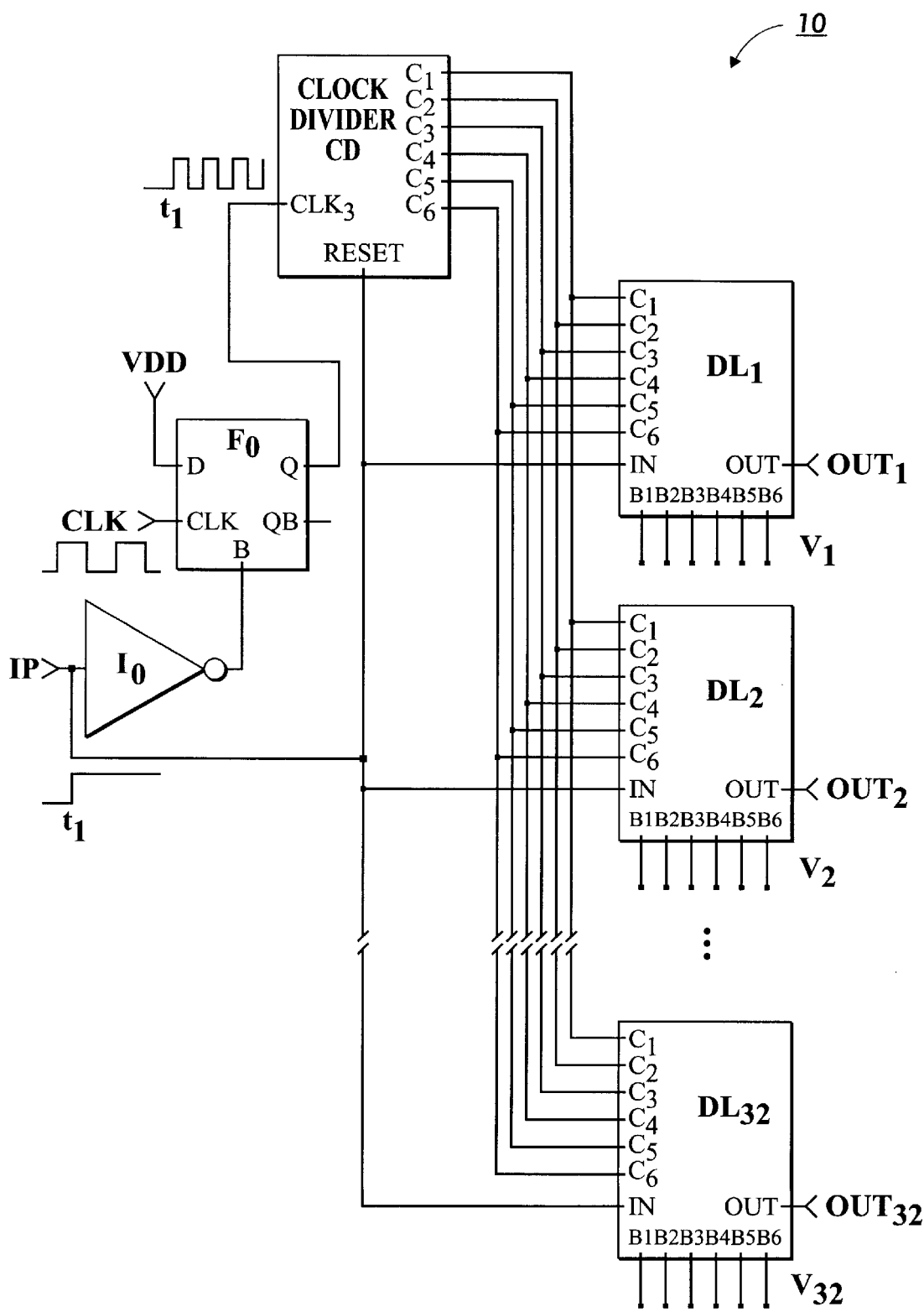
FIG. 3 shows a block diagram of the delay logic of this invention.

Referring to FIG. 3, there is shown a block diagram of the delay logic 10 of this invention. In FIG. 3, a clock divider CD divides the system clock CLK and generates 6 clocks $C_1$, $C_2$, $C_3$, $C_4$, $C_5$, and $C_6$ with periods of T, 2T, 4T, 8T, 16T, and 32T and sends them to the delay logic blocks $DL_1$–$DL_{32}$ of different lines.

Figure 1:
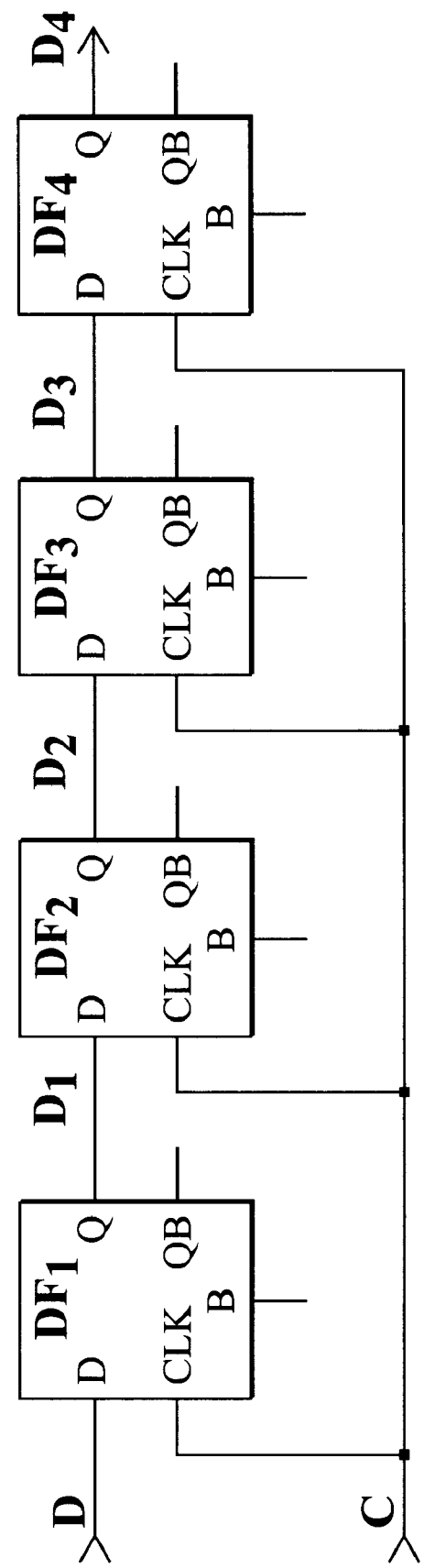
FIG. 1 shows a prior art D flip flop logic required for 4 clock cycle delays.
Figure 2:
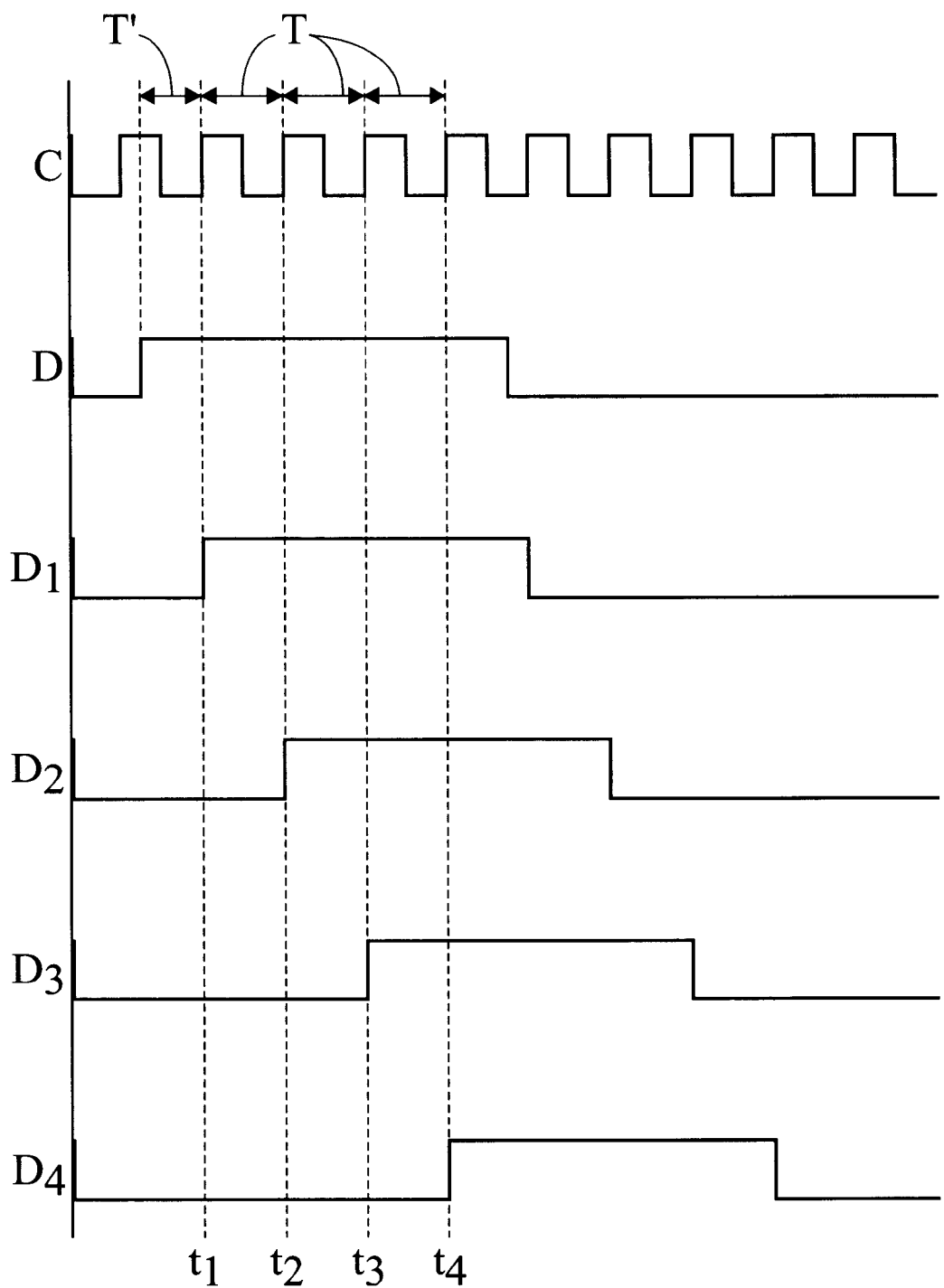
FIG. 2 shows a clock, input signal, and a plurality of output signals applied to logic design of FIG. 1.

Referring back to FIGS. 1 and 2, flip flop $DF_1$ delays signal D by T' since the rising edge happens between the two rising edges of the clock C. In order to prevent partial delay, in FIG. 3, flip flop $F_0$ is placed in the path of system clock CLK to the clock divider CD. The D input of flip flop $F_0$ is connected to VDD to continuously keep the D input of flip flop $F_0$ at high (1). The positive output (Q) of $F_0$ is connected to the clock divider CD. The input pulse which needs to be delayed, is connected to the Reset line of the $F_0$ through an inverter $I_0$. The clock input of flip flop $F_0$ receives the system clock CLK.

In operation, flip flop $F_0$ keeps the system clock CLK until it receives the rising edge of IP which inactivates the reset of flip flop $F_0$. Then, $F_0$ sends out the system clock as a synchronized clock $CLK_s$ to the CD block. Since $CLK_s$ is synchronized with the input pulse IP, the input pulse IP will receive full delays.

Figure 4:
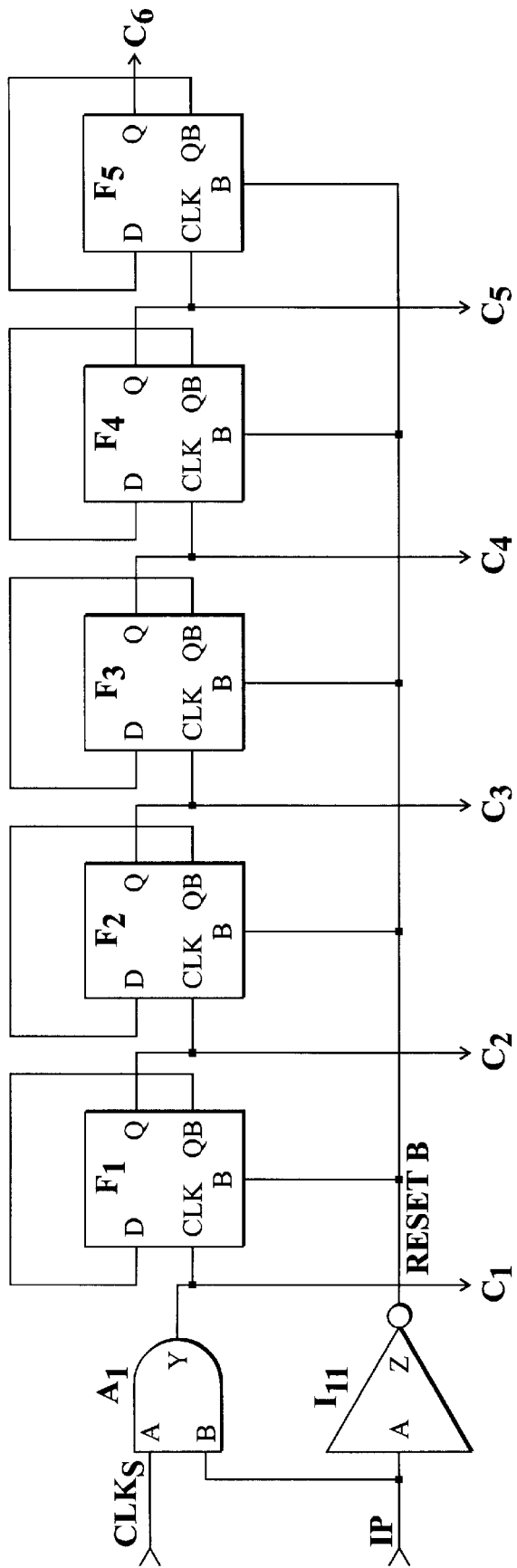
FIG. 4 shows a detail block diagram of the clock divider of FIG. 3.

Referring to FIG. 4, there is shown a detail block diagram of the clock divider CD of FIG. 3. In FIG. 4, the system reset input pulse IP is sent to the reset pin of flip flops $F_1$, $F_2$, $F_3$, $F_4$, and $F_5$ through inverter $I_{11}$. The synchronized system clock $CLK_s$ and the input pulse IP are sent to an AND gate $A_1$ to generate a resetable clock $C_1$ with the same period as the synchronized system clock $CLK_s$. To divide clock $C_1$, five flip flops $F_1$, $F_2$, $F_3$, $F_4$, and $F_5$ are used. $C_1$ is sent to $F_1$ as a clock. The negative output (QB) of each one of the flip flops $F_1$, $F_2$, $F_3$, $F_4$, and $F_5$ is connected to its input. This configuration causes each flip flop $F_1$, $F_2$, $F_3$, $F_4$, and $F_5$ to divide its clock by 2. The positive output (Q) of each flip flop $F_1$, $F_2$, $F_3$, $F_4$, and $F_5$ is connected to the clock of the following flip flop. In addition, the positive output of flip flops $F_1$, $F_2$, $F_3$, $F_4$, and $F_5$ are sent out as clocks $C_2$, $C_3$, $C_4$, $C_5$, and $C_6$ respectively.

Figure 5:
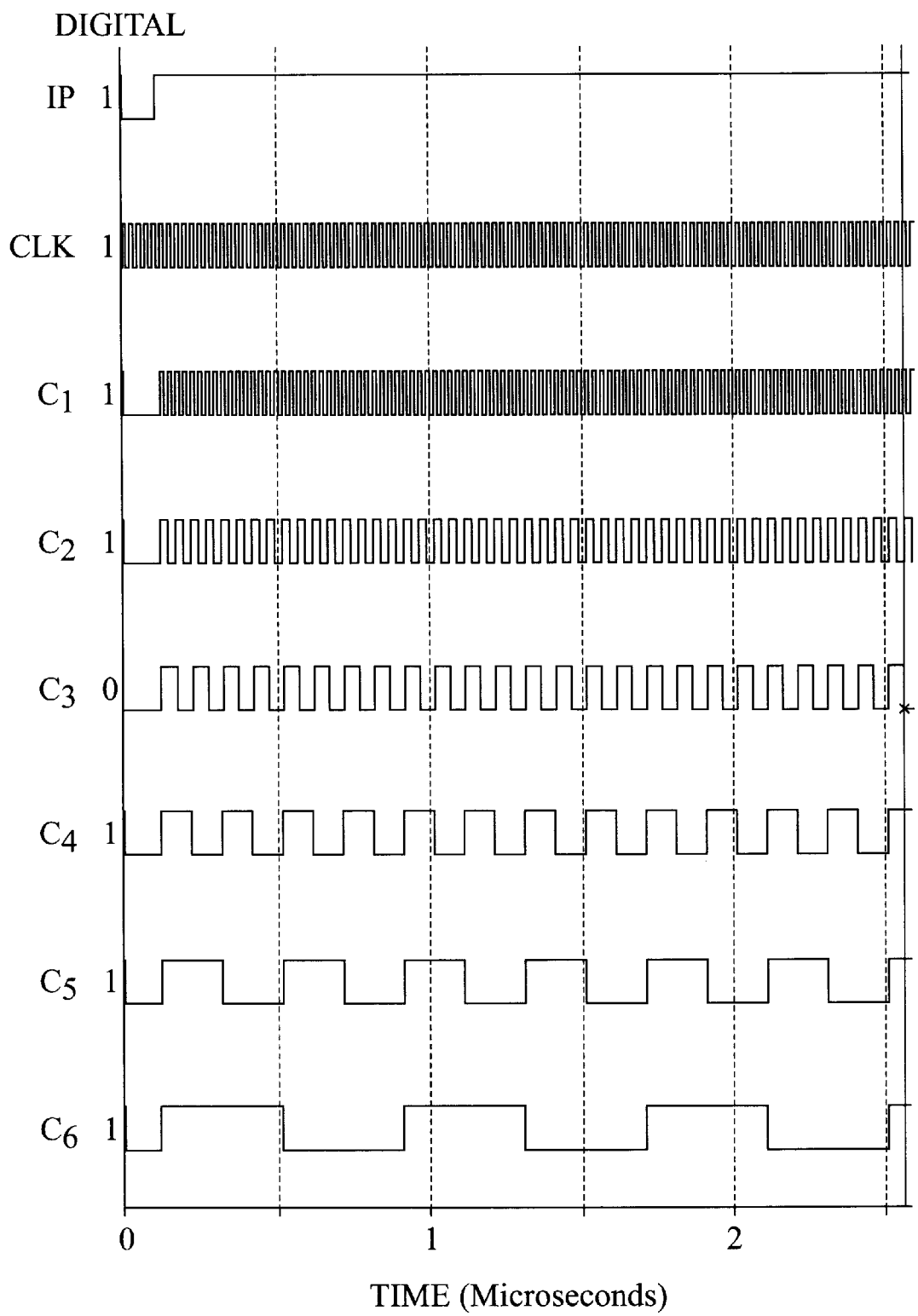
FIG. 5 shows different periods of clocks of FIG. 3.

Since each flip flop $F_1$, $F_2$, $F_3$, $F_4$, and $F_5$ divides its clock by 2 and sends it out on its positive output, $C_2$ has a period twice as its input clock. Since the period of clock $C_1$ is equal to the period T of the synchronized system clock CLKs, the period of clock $C_2$ is 2T. In the same manner, the periods of clocks $C_3$, $C_4$, $C_5$, and $C_6$ are 4T, 8T, 16T, and 32T as shown in FIG. 5.

Referring back to FIG. 3, clocks $C_1$, $C_2$, $C_3$, $C_4$, $C_5$, and $C_6$ are sent to all delay bocks $DL_1$–$DL3_2$ where each delay block selects a combination of the clocks $C_1$, $C_2$, $C_3$, $C_4$, $C_5$, and $C_6$ to create a required delay. Each delay block $DL_1$–$DL_{32}$ receives the input pulse IP and a six bit delay value $V_1$–$V_{32}$. By using clocks $C_1$, $C_2$, $C_3$, $C_4$, $C_5$, and $C_6$, each delay block $DL_1$–$DL_{32}$ delays the input pulse IP according to its respective delay value $V_1$–$V_{32}$ and sends it out on its output $OUT_1$–$OUT_{32}$ respectively.

Figure 6:
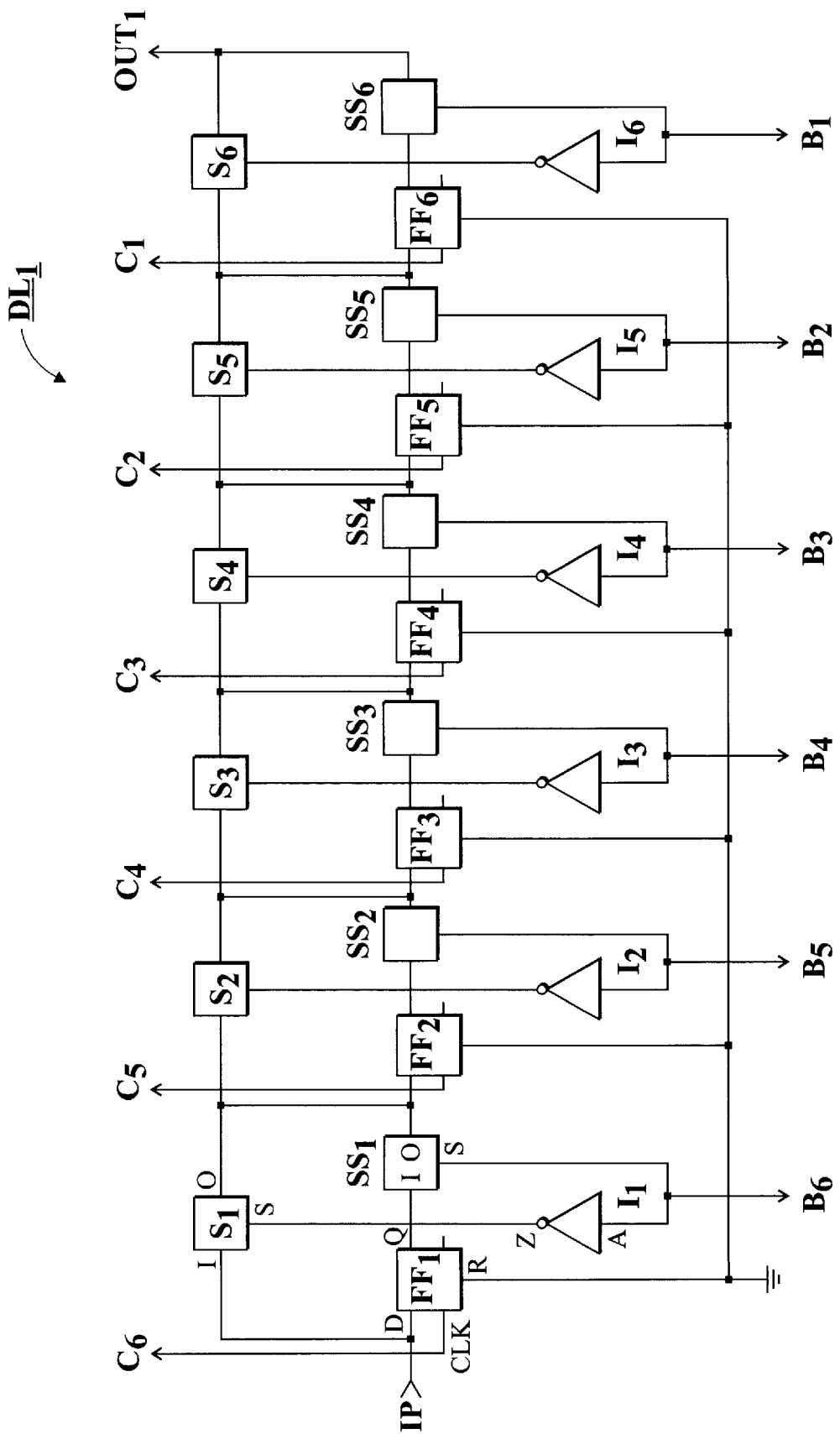
FIG. 6 shows a logic diagram of one of the delay blocks.

Referring to FIG. 6, there is shown a logic diagram one of the delay block $DL_1$. It should be noted that the delay blocks $DL_2$–$DL_{32}$ are identical to $DL_1$. In delay block $DL_1$, there are six D flip flops $FF_1$, $FF_2$, $FF_3$, $FF_4$, $FF_5$, $FF_6$. The clock inputs of the flip flops $FF_1$, $FF_2$, $FF_3$, $FF_4$, $FF_5$, $FF_6$ are connected to the clocks $C_6$, $C_5$, $C_4$, $C_3$, $C_2$, and $C_1$ respectively.

The positive output of each flip flop $FF_1$, $FF_2$, $FF_3$, $FF_4$, and $FF_5$ is connected to the input of the following flip flop through switches $SS_1$, $SS_2$, $SS_3$, $SS_4$, and $SS_5$ respectively. The positive output of flip flop $FF_6$ is connected to the output $OUT_1$ of the delay line1 through switch $SS_6$. The input of each flip flop $FF_1$, $FF_2$, $FF_3$, $FF_4$, $FF_5$, $FF_6$ is connected to the input of the following flip flop through switches $S_1$, $S_2$, $S_3$, $S_4$, $S_5$, and $S_6$ respectively.

Each delay block $DL_1$–$DL_{32}$ of FIG. 3 receives a separate delay value through $V_1$–$V_{32}$ respectively. Each $V_1$–$V_{32}$ has six bits $B_1$, $B_2$, $B_3$, $B_4$, $B_5$, and $B_6$ which deliver a number between 0 to 63. $B_1$, $B_2$, $B_3$, $B_4$, $B_5$, and $B_6$ are directly connected to the control pins of switches $SS_1$, $SS_2$, $SS_3$, $SS_4$, $SS_5$, and $SS_6$ respectively and connected to the control pins of switches $S_1$, $S_2$, $S_3$, $S_4$, $S_5$, and $S_6$ through inverters $I_1$, $I_2$, $I_3$, $I_4$, $I_5$, and $I_6$ respectively.

In FIG. 6, every time one of the bits $B_6$, $B_5$, $B_4$, $B_3$, $B_2$, and $B_1$ is high (1), its respective switch $SS_1$, $SS_2$, $SS_3$, $SS_4$, $SS_5$, and $SS_6$ closes. For example, if $B_4$ is high (1) switch $SS_3$ closes and connects the positive output of $FF_3$ to the input of $FF_4$. However, every time one of the bits $B_6$, $B_5$, $B_4$, $B_3$, $B_2$, and $B_1$, is low (0), its respective switch $S_1$, $S_2$, $S_3$, $S_4$, $S_5$, and $S_6$ closes. For example, if $B_4$ is low (0) switch $S_3$ closes and connects the input of $FF_3$ to the input of $FF_4$. In other words, when one of the bits $B_6$, $B_5$, $B_4$, $B_3$, $B_2$, and $B_1$, is high (1), the output of the previous flip flop is delivered to the input of the following flip flop, but if it is low (0), the previous flip flop is by passed and its input is delivered to the input of the next flip flop.

With the configuration of FIG. 6, the high (1) bits $B_6$, $B_5$, $B_4$, $B_3$, $B_2$, and $B_1$ select the proper delay. For example, if the six bits $B_6$, $B_5$, $B_4$, $B_3$, $B_2$, and $B_1$ represent 100011, it means 32+2+1=35 delay is needed. Since $B_6$ is (1), switch $SS_1$ closes and flip flop $FF_1$ becomes active. Therefore, the input of flip flop $FF_1$ is delayed by 32T since FFis clocked by clock $C_6$ which has a clock cycle of 32T. It should be noted that the input of the flip flop $FF_1$ is the input pulse IP that has to be delayed. Since, bits $B_5$, $B_4$, and $B_3$ are zero, switches $S_2$, $S_3$, and $_{s4}$ close, by pass flip flops $FF_2$, $FF_3$, and $FF_4$, and deliver the output of flip flop $FF_1$ to the input of $FF_5$.

Figure 7:
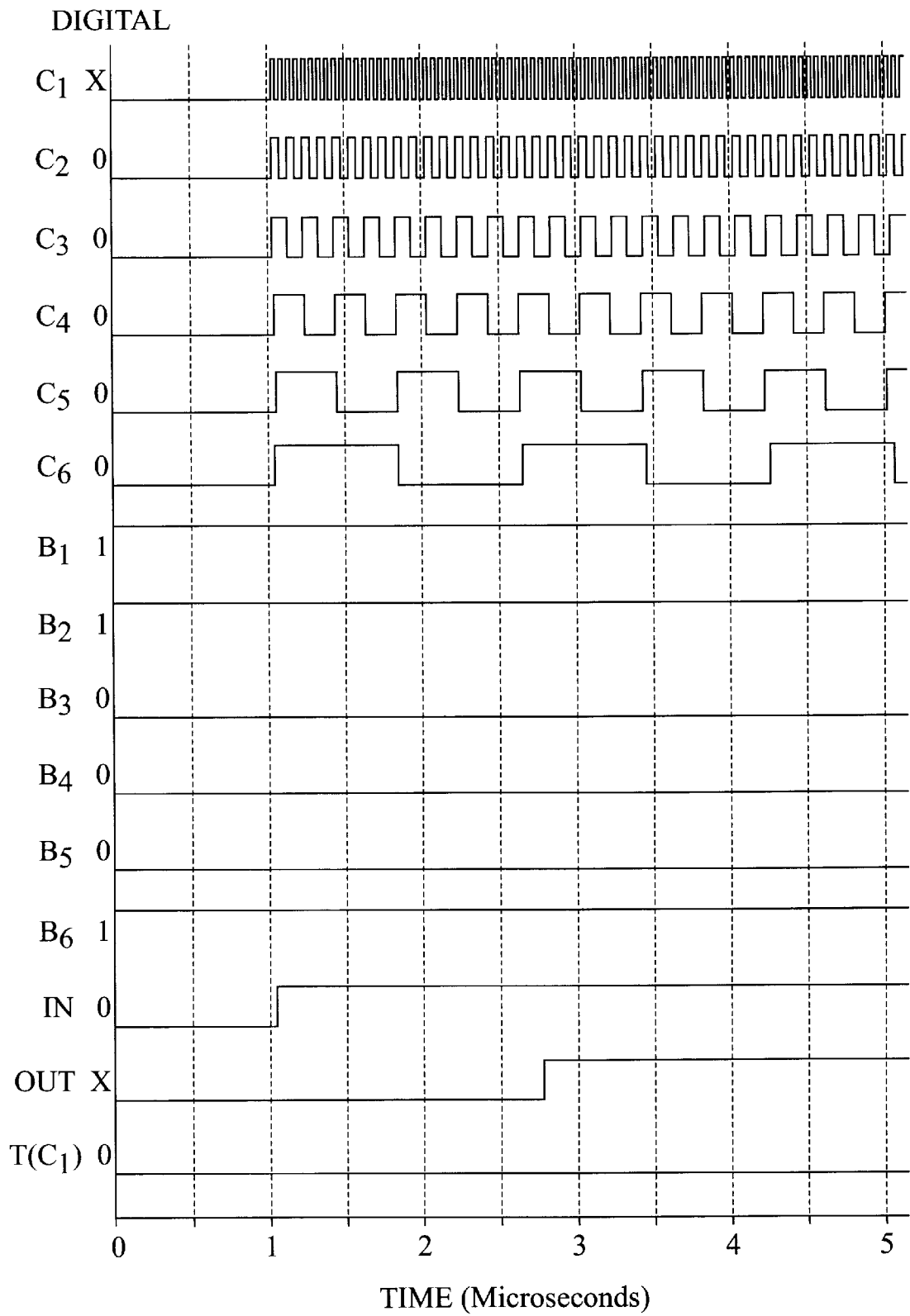
FIG. 7 shows the signals of FIG. 6 for a delay of 35T.

Since bits $B_2$ and $B_1$ are high (1), both switches $SS_5$ and $SS_6$ close and activate flip flops $FF_5$ and $_{FF6}$. Since flip flop $FF_5$ receives clock $C_2$, it delays its input (output of $FF_1$ which is delayed by 32T) by 2T. Therefore, the output of flip flop $FF_5$ is delayed by 32T+2T=34T. Flip flop $FF_6$ uses clock $C_1$ which has a delay of T. Subsequently, flip flop $FF_6$ delays the output of $FF_5$ by T. Therefore the output of flip flop $FF_6$ which through switch $SS_6$ is connected to the $OUT_1$ provides a signal with 35T delay. The result is shown in FIG. 7.

At the power on, the outputs of the flip flops $FF_1$, $FF_2$, $FF_3$, $FF_4$, $FF_5$, and $FF_6$ can be at don't care (unknown) state.

In order to prevent any error in the delay circuit, flip flops $FF_1$, $FF_2$, $FF_3$, $FF_4$, $FF_5$, and $FF_6$ have to receive a reset.

Figure 8:
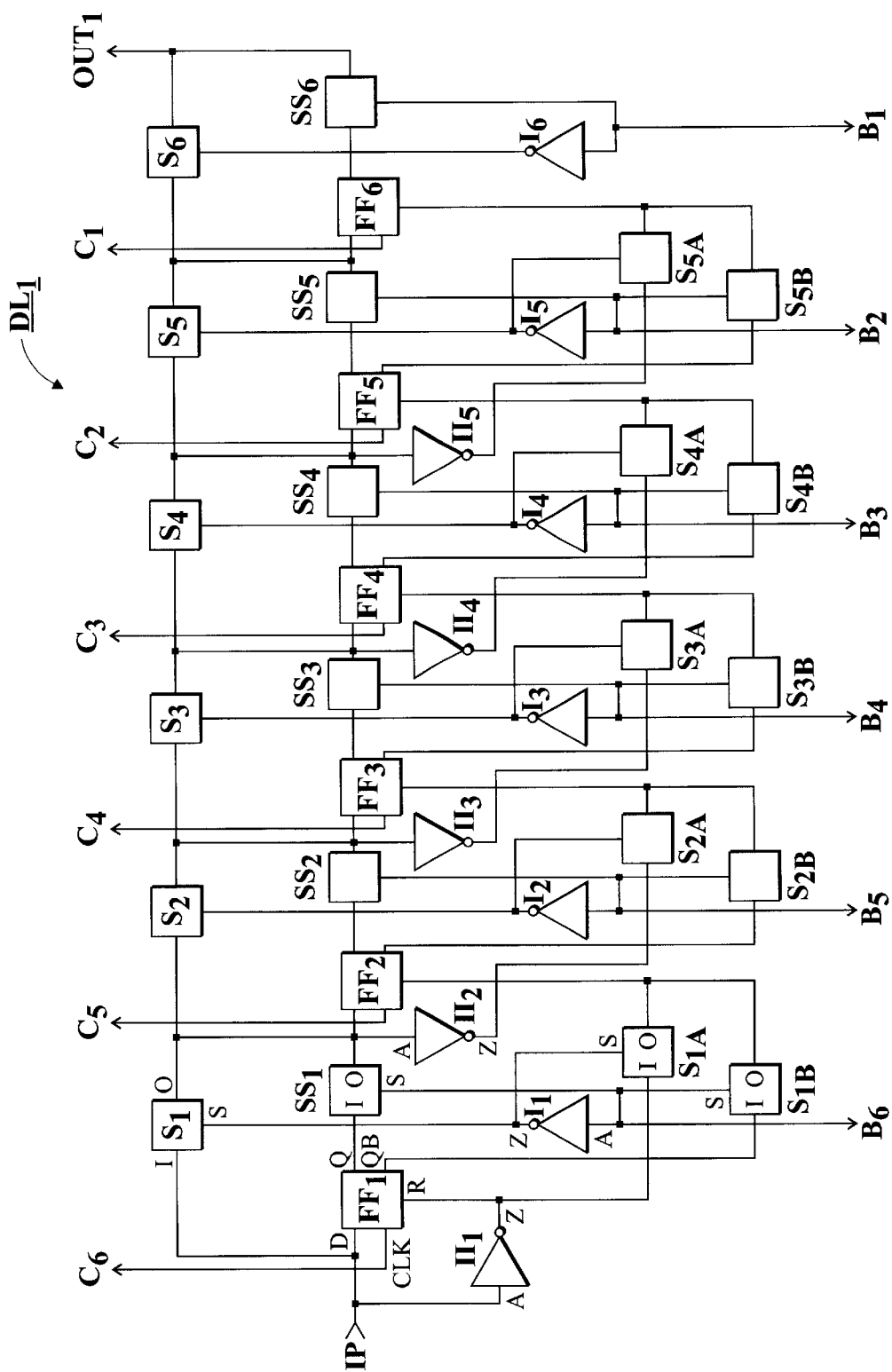
FIG. 8 shows the logic diagram of FIG. 6 with the addition of reset connections.

Referring to FIG. 8, there is shown the logic diagram of FIG. 6 with the addition of reset connections. Each flip flop $FF_2$, $FF_3$, $FF_4$, $FF_5$, and $FF_6$ receives a Reset signal from one of two switches ($S_{1A}$ and $S_{1B}$), ($S_{2A}$ and $S_{2B}$), ($S_{3A}$ and $S_{3B}$), ($S_{4A}$ and $S_{4B}$), and ($S_{5A}$ and $S_{5B}$) respectively. The control pins of switches $S_{1B}$, $S_{2B}$, $S_{3B}$, $S_{4B}$, and $S_{5B}$ are connected to $B_6$, $B_5$, $B_4$, $B_3$, and $B_2$ respectively. However, the control pins of switches $S_{1A}$, $S_{2A}$, $S_{3A}$, $S_{4A}$, and $S_{5A}$ are connected to $B_6$, $B_5$, $B_4$, $B_3$, and $B_2$ through inverters $I_1$, $I_2$, $I_3$, $I_4$, and $I_5$ respectively. The negative output (QB) of flip flops $FF_1$, $FF_2$, $FF_3$, $FF_4$, and $FF_5$ are connected to the reset pin of flip flops $FF_2$, $FF_3$, $FF_4$, $FF_5$, and $FF_6$ through switches $S_{1B}$, $S_{2B}$, $S_{3B}$, $S_{4B}$, and $S_{5B}$. Furthermore, the input of flip flops $FF_1$, $FF_2$, $FF_3$, $FF_4$, and $FF_5$ are connected to the reset pin of flip flops $FF_2$, $FF_3$, $FF_4$, $FF_5$, and $FF_6$ through inverters and switches ($II_1$ and $S_{1A}$), ($II_2$ and $S_{2A}$), ($II_3$ and $S_{3A}$), ($II_4$ and $S_{4A}$), and ($II_5$ and $S_{5A}$) respectively. Flip flop $FF_1$ is reset by the input signal IP through inverter $II_1$.

At the power on, when the input signal IP is low (0), if a flip flop becomes active for example $FF_1$, the input pulse IP (0) will be sent to the positive output (Q). Therefore, the output (QB) becomes (1) and resets the following flip flop $FF_2$ through $S_{1B}$. Every time a flip flop is by passed for example $FF_1$, then its input (input pulse 0) will reset the following flip flop $FF_2$ through $II_1$ and $S_{1A}$. As a result, when the input signal is low the delay block $DL_1$ will be reset and $OUT_1$ becomes 0. Once the input signal IP becomes high (1), then the logic diagram of FIG. 8 creates delays as described for the logic diagram of FIG. 6.

Referring to FIG. 9, when an input signal IP with a rising edge at $t_1$ and a falling edge at $t_2$ is sent to the delay logic 10 of FIG. 3, each line will delay the rising edge of the same input pulse IP with a different delay value. Therefore, Output lines $OUT_1$, $OUT_2$ and $OUT_{32}$ delay the rising edge of IP and send it out at $t_{11}$, $t_{13}$, and $t_{12}$ respectively. However, when the falling edge of the input pulse IP at $t_2$ enters logic 10, all the outputs $OUT_1$, $OUT_2$ and $OUT_{32}$ will become 0. It should be noted that each line can have a different delay and therefore each output can have less or more delay than what is shown. The delay logic 10 provides pulse width modulation since each line sends out a signal with a rising edge that has a different timing, but a falling edge concurrent with the falling edge of the signals of the other outputs $OUT_1$–$OUT_{32}$. As a result, the width of each output pulse is determined by its respective delay value $V_1$–$V_{32}$.

The logic diagram of FIG. 3 is designed to create 0–64T delays for each signal of 32 lines. However, the concept of this invention can be applied to different number of delays on different number of lines.

Referring to FIG. 10, there is shown an alternative pulse width modulation of this invention. In FIG. 10, the input pulse IP is inverted through inverter $I_{IN}$ before applying to block $DL_1$ and the output $OUT_1$ of $DL_1$ is connected to inverter $I_{OUT}$. In FIG. 10, the rising edge of the input pulse IP at $t_1$ will reset the $DL_1$ block and the falling edge of the input pulse $t_2$ will be delayed. Therefore, $I_{OUT}$ sends out a signal with a rising edge at $t_2$ and a falling edge at $t_{21}$ (the delayed falling edge of the input pulse IP). If this inversion is applied to all blocks $DL_1$–$DL_{32}$ of FIG. 3, they will provide pulse width modulation by concurrently sending out the rising edge of the input pulse and delaying the falling edge of the input pulse IP according to their respective delay values $V_1$–$V_{32}$.

Referring back to FIG. 3, each delay block $DL_1$–$DL_{32}$ has six flip flops (FIGS. 6 and 7) and clock divide block CD has five flip flop. Therefore, the logic diagram of FIG. 3 has (32×6)+5=197 flip flops as opposed to 2068 flip flops of the prior art. The disclosed embodiment of this invention significantly reduces the number of flip flops, the silicon real estate, the size of the packaged chip, and finally the cost of the system using this chip.

It should be noted that numerous changes in details of construction and the combination and arrangement of elements may be resorted to without departing from the true spirit and scope of the invention as hereinafter claimed.

What is claimed is:

1. A pulse width modulation circuit comprising:
   a clock dividing means for receiving a system clock and generating a plurality of clocks with different clock cycles;
   a delaying means for receiving a signal and delaying said signal;
   said delaying means having a plurality of delaying elements;
   each of said plurality of delaying elements receiving one of said plurality of clocks;
   said delaying means receiving a delay data and being responsive to said delay data for selecting a number of said plurality of clocks based on the delay data and activating said respective delaying elements; and
   said delaying means being so constructed and arranged to cause the signal to pass through said activated delaying elements and bypass said inactivated delaying elements.

2. The pulse width modulation circuit recited in claim 1 further comprises synchronizing block for synchronizing said system clock with the rising edge of said signal prior to delivery to said clock dividing means.

3. The pulse width modulation circuit recited in claim 1, wherein said plurality of delaying elements are positive edge triggered D flip flops.

4. A pulse width modulation circuit comprising:
   a clock dividing means for receiving a system clock and generating a plurality of clocks with different clock cycles;
   a delaying means for receiving a signal having a rising edge and a falling edge and delaying said rising edge of said signal;
   said delaying means having a plurality of delaying elements;
   each of said plurality of delaying elements receiving one of said plurality of clocks;
   said delaying means receiving a delay data and being responsive to said delay data for selecting a number of said plurality of clocks based on the delay data and activating said respective delaying elements;
   said delaying means being so constructed and arranged to cause the signal to pass through said activated delaying elements and bypass said inactivated delaying elements; and
   said delaying means having a reset means responsive to said falling edge of said signal for resetting said delaying means.

5. The pulse width modulation circuit recited in claim 4 further comprises synchronizing block for synchronizing said system clock with the rising edge of said signal prior to delivery to said clock dividing means.

6. The pulse width modulation circuit recited in claim 4, wherein said plurality of delaying elements are positive edge triggered D flip flops.

7. A pulse width modulation circuit comprising:
   a clock dividing means for receiving a system clock and generating a plurality of clocks with different clock cycles;
   a plurality of delaying means for receiving a signal and delaying said signal according to a plurality of data;
   each of said delaying means having a plurality of delaying elements;
   each of said plurality of delaying elements of each delaying means receiving one of said plurality of clocks;
   each of said plurality of delaying means receiving one of said plurality of delay data and being responsive to said respective delay data for selecting a number of said plurality of clocks based on the delay data and activating said respective delaying elements; and
   each of said delaying means being so constructed and arranged to cause the signal to pass through said respective activated delaying elements and bypass said respective inactivated delaying elements.

8. The pulse width modulation circuit recited in claim 7 further comprises synchronizing block for synchronizing said system clock with the rising edge of said signal prior to delivery to said clock dividing means.

9. The pulse width modulation circuit recited in claim 7, wherein said plurality of delaying elements are positive edge triggered D flip flops.

10. A pulse width modulation circuit comprising:
    a clock dividing means for receiving a system clock and generating a plurality of clocks with different clock cycles;
    a plurality of delaying means for receiving a signal having a rising edge and a falling edge and delaying said rising edge of said signal according to a plurality of data;
    each of said delaying means having a plurality of delaying elements;
    each of said plurality of delaying elements of each delaying means receiving one of said plurality of clocks;
    each of said plurality of delaying means receiving one of said plurality of delay data and being responsive to said respective delay data for selecting a number of said plurality of clocks based on the delay data and activating said respective delaying elements; and
    each of said delaying means being so constructed and arranged to cause the signal to pass through said respective activated delaying elements and bypass said respective inactivated delaying elements; and
    said delaying means having a reset means responsive to said falling edge of said signal for resetting said delaying means.

11. The pulse width modulation circuit recited in claim 10 further comprises synchronizing block for synchronizing said system clock with the rising edge of said signal prior to delivery to said clock dividing means.

12. The pulse width modulation circuit recited in claim 10, wherein said plurality of delaying elements are positive edge triggered D flip flops.

* * * * *